United States Patent
Lee

(10) Patent No.: US 6,400,864 B1
(45) Date of Patent: Jun. 4, 2002

(54) BROAD BAND SEMICONDUCTOR OPTICAL AMPLIFIER MODULE HAVING OPTICAL AMPLIFIERS FOR AMPLIFYING DEMUTIPLEXED SIGNALS OF DIFFERENT WAVELENGTHS AND OPTICAL COMMUNICATION SYSTEM USING IT

(75) Inventor: Youngkun Lee, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 79 days.

(21) Appl. No.: 09/655,827

(22) Filed: Sep. 6, 2000

(30) Foreign Application Priority Data

Sep. 9, 1999 (JP) ............................................. 11-255567

(51) Int. Cl.$^7$ ............................. G02B 6/28; H04J 14/02; H01S 3/30
(52) U.S. Cl. ............................. 385/24; 385/24; 385/42; 385/47; 385/14; 359/124; 359/115; 359/123; 359/133; 359/134; 359/341; 359/345; 372/6
(58) Field of Search .............................. 385/24, 42, 47, 385/14; 359/124, 115, 123, 133, 134, 341, 345; 372/6

(56) References Cited

U.S. PATENT DOCUMENTS

| | | | | |
|---|---|---|---|---|
| 4,945,531 A | * | 7/1990 | Suzuki | ........................... 370/3 |
| 5,394,489 A | * | 2/1995 | Koch | ........................... 385/14 |
| 5,589,969 A | * | 12/1996 | Taga et al. | ................... 359/124 |

OTHER PUBLICATIONS

Japanese paper "Research and Development Report of Femtsecond Technology (1997)", pp. 431–441.
Japanese journal "Nikkei Electronics", No. 719, Jun. 29, 1998, pp. 101–106.
JP-A-10-229238.
Japanese journal "Kogaku (or Optics)", vol. 25, 1996, pp. 618–623.
Japanese journal "Ohyo–Butsuri (or Applied Physics)", vol. 59, No. 9, 1990, p. 1227.
JP-A-7-176824.
Japanese journal "Kogaku (or Optics)", vol. 26, 1997, pp. 418–423.
Microwave and Optical Technology Letters, vol. 7, No. 3, Feb. 20, 1994, pp. 132–139.
Optics Letters, Jan. 1, 1995, vol. 20, No. 1, pp. 43–45.
Journal of Lightwave Technology, vol. 12, No. 6, Jun. 1994, pp. 957–962.
IEEE Photonics Technology Letters, vol. 3, No. 9, Sep. 1991, pp. 812–815.

* cited by examiner

Primary Examiner—Brian Healy
Assistant Examiner—Sarah Woo
(74) Attorney, Agent, or Firm—Antonelli, Terry, Stout & Kraus, LLP

(57) ABSTRACT

A semiconductor optical amplifier module comprises: a demultiplexer made of a semiconductor material to separate an optical input signal containing a plurality of wavelength components into a plurality of demultiplexed signals, each of the demultiplexed signals having a different one of the wavelength component; a plurality of semiconductor optical amplifiers each optically coupled to the demultiplexer to amplify a corresponding one of the demultiplexed signals; and a multiplexer made of the semiconductor material and optically coupled to the plurality of semiconductor optical amplifiers to combine the demultiplexed signals amplified by the semiconductor optical amplifiers to produce a multiplexed signal. The demultiplexer, the semiconductor amplifiers and the multiplexer are integrated on a single semiconductor substrate. The demultiplexer and the multiplexer may be implemented by arrayed waveguide diffraction grating structures, and the semiconductor optical amplifiers may be implemented by a semiconductor quantum well structure having well widths ranging from a minimum value to a maximum value. The semiconductor optical amplifiers can provide a gain wavelength bandwidth of 80–800 nm.

19 Claims, 11 Drawing Sheets

BROAD BAND SEMICONDUCTOR OPTICAL AMPLIFIER MODULE HAVING OPTICAL AMPLIFIERS FOR AMPLIFYING DEMUTIPLEXED SIGNALS OF DIFFERENT WAVELENGTHS AND OPTICAL COMMUNICATION SYSTEM USING IT

BACKGROUND OF THE INVENTION

The present invention relates to a semiconductor optical amplifier module and an optical communication system, and more particularly to a technology which is effective when applied to semiconductor optical amplifiers for use in long-distance or short-distance, large-capacity optical communication systems such as wavelength-division-multiplexing communication systems.

Wavelength-division-multiplexing communication systems will become the mainstay as a next-generation optical communication system for supporting the future information infrastructure, and their trunk line systems are said to require a transmission rate of 1–10 Tbit/s (see "Research and Development Report of Femtosecond Technology (1997)", published in March 1997, pp. 431–441, Femtosecond Technology Research Association). The wavelength-division-multiplexing communication systems are described on pp. 101–106 of "Nikkei Electronics"(No. 719) published by Nikkei Business Publications, Inc. on Jun. 29, 1998.

The term "wavelength-division-multiplexing (WDM) communication system" means an optical communication system which uses a plurality of optical signals each having a different wavelength and collectively transmits such optical signals via an optical fiber to implement transmission of as many signals as possible per unit time (frequency-division multiplexing of signals). Currently available WDM optical communication systems can transmit on a single optical fiber a multiplexed optical signal having a plurality of 1.55 $\mu$m-band different wavelengths at an interval of 0.8 nm (100 GHz). Each wavelength is transmitted at a rate of 10 Gbit/s.

On the other hand, optical amplifiers which perform optical amplification at repeating points in an optical communication system are divided roughly into two types: an optical fiber amplifier and a semiconductor laser amplifier. The optical fiber amplifier uses an optical fiber as an amplifying medium, which is prepared by adding a rare earth element to a part of or to the whole of its core, and by optically exciting the core with a high-output semiconductor laser. The gain wavelength band of the conventional optical fibers ranges from 1.53 $\mu$m to 1.56 $\mu$m (gain wavelength bandwidth: 30 nm) and from 1.565 $\mu$m to 1.6 $\mu$m (gain wavelength bandwidth: 35 nm) in the vicinity of the 1.55 $\mu$m band, as disclosed in JP-A-10-229238 (laid open on Aug. 25, 1998).

The semiconductor laser amplifier has basically the same structure as a semiconductor laser, and produces an optical gain by injecting a current into an active layer which serves as an optical waveguide (see pp. 618–623 of "Optics"(Vol. 25) published by the Japan Society of Applied Physics in 1996). The active layer has a double heterostructure or a quantum well structure. By changing the material or composition of the active layer, one can fabricate a plurality of amplifiers each dedicated to a wavelength to be amplified. Unlike a semiconductor laser, the optical input/output facets of the semiconductor laser amplifier must have very low reflectivity in order to suppress laser oscillation. In this case, the gain bandwidth is said to be in the order of several THz (about tens of nanometers) (see p. 1227 of "Applied Physics" (Vol. 59, No. 9) published by the Japan Society of Applied Physics in 1990).

The conventional optical amplifiers have limited gain wavelength bandwidths ranging from about 50 nm to 60 nm, which are not usable as optical amplifiers for WDM optical communication systems having a transmission rate of 1–10 Tbit/s. Proposed as a solution to this problem of limited gain bandwidths is a method of using a demultiplexer/multiplexer comprising directional couplers and Y-branch waveguides to amplify input signals each having a different wavelength at a plurality of optical amplifying regions each having a different gain wavelength bandwidth, respectively (JP-A-7-176824 laid open on Jul. 14, 1995). However, this publication discloses only the method of amplifying two demultiplexed signals respectively having wavelengths of 1.30 $\mu$m and 1.55 $\mu$m, but proposes no technology for amplifying a wavelength-multiplexed signal containing 100 or more demultiplexed signal components.

To implement a transmission rate of 1–10 Tbit/s, the conventional WDM optical communication systems is required to combine 100 to 1000 wavelengths into a wavelength-multiplexed signal, and their gain wavelength band is in the range of 80–800 nm. Therefore, optical amplifiers to be employed in WDM optical communication systems must have a band broad enough to satisfy this gain wavelength band (80–800 nm).

Further, the WDM optical communication systems use wavelengths arranged at narrow intervals, e.g., at about 1 nm. For the demultiplexing/multiplexing of an optical signal containing a large number of wavelength components arranged at narrow intervals, the systems employ many directional couplers and Y-branch waveguides as mentioned before, and this has imposed a problem of increased element size.

On the other hand, each semiconductor optical amplifier addresses (1) a problem of reduced gain (gain saturation) due to the intensity of the amplified light increasing and the carrier density within the active layer of the amplifier thereby reducing when the optical intensity of an incident signal is increased, and (2) a problem of phenomenon (four wave mixing) which produces a new optical signal due to wavelength conversion caused by nonlinear optical effects during transmission through a semiconductor of a plurality of signals each having a different wavelength.

SUMMARY OF THE INVENTION

One object of the present invention is to provide a broad band semiconductor optical amplifier module and an optical communication system capable of dealing with Tbit/s-order high-speed transmission which is increasingly required for transmitting video information and moving picture information used in the rapidly proliferating Internet.

Another object of the present invention is to provide a semiconductor optical amplifier module and an optical communication system exhibiting a lesser degree of gain reduction caused by gain saturation.

Still another object of the present invention is to provide a semiconductor optical amplifier module in which four wave mixing is hard to occur.

Even another object of the present invention is to provide a broad band and downsized semiconductor optical amplifier module exhibiting a lesser degree of gain reduction, which is capable of simultaneously amplifying as many as 100 to 1000 wavelength components or more arranged at a narrow interval of about 1 nm or less.

According to one aspect of the present invention, an optical input signal contains, e.g., as many as 100 to 1000 wavelength components or more, and such an input signal is separated by a demultiplexer into a plurality of demultiplexed signals each having a different one of the wavelength components. The plurality of demultiplexed signals are amplified by a plurality of spatially separated, independent amplifiers, respectively, and the amplified demultiplexed signals are combined by a multiplexer to produce a single amplified optical output signal having the plurality of wavelength components. The demultiplexer, the amplifiers, and the multiplexer are formed on a single semiconductor substrate, and the optical amplifiers are optically coupled to the demultiplexer and the multiplexer. The plurality of amplifiers have a multiple-quantum-well structure, at least one being provided on the semiconductor substrate for each of the wavelength components.

The above and other novel features of the present invention will become apparent from the description of this specification and the accompanying drawings.

DESCRIPTION OF THE EMBODIMENTS

Figure 1:
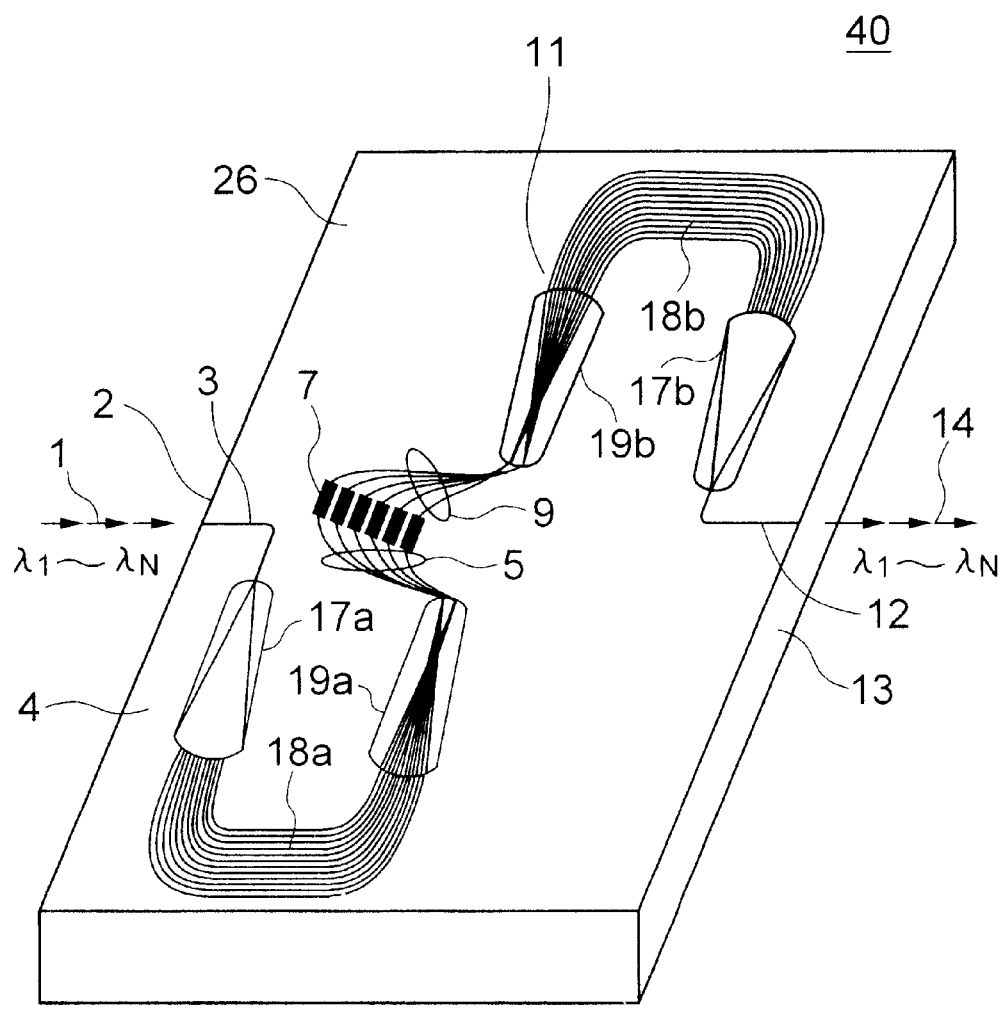
FIG. 1 is a schematic perspective view of a semiconductor optical amplifier module which is a first embodiment of the present invention.

We will now describe embodiments of the present invention in detail with reference to the drawings. For all the drawings which will be referred to for illustrating the embodiments, parts and components having the same functions are denoted by the same reference numerals, and any repeated description will be omitted.

First Embodiment

Figure 2:
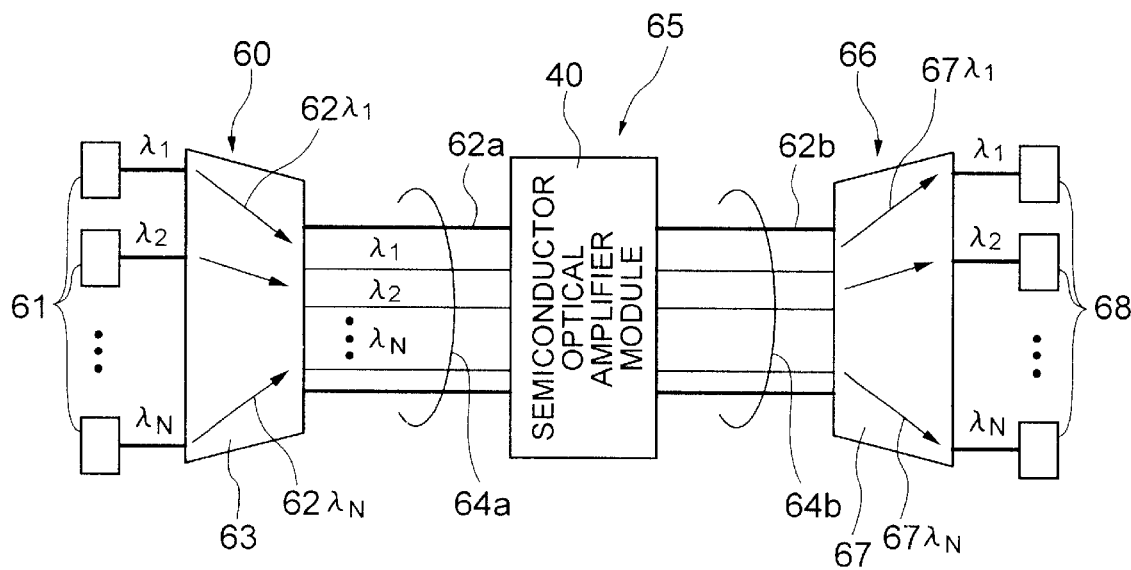
FIG. 2 is a block diagram schematically showing an optical communication system into which the same semiconductor optical amplifier module is incorporated.
Figure 3:
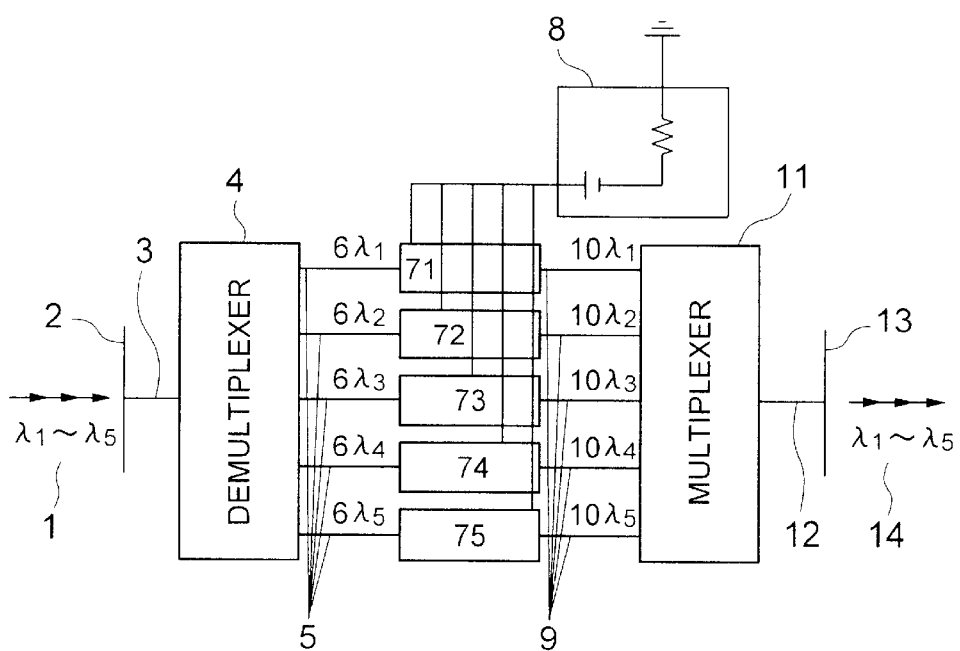
FIG. 3 is a block diagram showing the configuration of the same semiconductor optical amplifier module.

FIGS. 1–7, 8A–8E, 9A–9B, 10A–10B, and 11A–11C are diagrams related to a semiconductor optical amplifier module which is a first embodiment of the present invention. FIG. 1 is a perspective view outlining the same semiconductor optical amplifier module, and FIG. 3 is a block diagram showing its functional configuration.

A semiconductor optical amplifier module 40 according to the first embodiment of the present invention comprises, as shown in FIG. 1, an input waveguide 3, a demultiplexer 4, an output waveguide 5, an optical amplifying unit 7 having a plurality of optical amplifiers, an input waveguide 9, a multiplexer 11, an output waveguide 12, all of which are optically coupled to each other sequentially while formed on one surface of a substrate 26, e.g. an n-type InP substrate 26. That is, the above-mentioned optical component parts are successively coupled through the optical waveguides constituting them, respectively. These optical waveguides are formed by patterning into a predetermined shape a semiconductor layer or a plurality of semiconductor layers which are formed over one surface of the n-type InP substrate 26.

The input waveguide 3 receives an input signal 1, which is an optical signal containing a plurality of different wavelength components $\lambda_1$–$\lambda_N$, and has an antireflection input facet 2. The output waveguide 12 transmits an output signal 14, which is an optical signal containing the same mutually different wavelength components $\lambda_1$–$\lambda_N$, and has an antireflection output facet 13. These antireflection input and output facets 2 and 13 exhibit low reflectivities ranging from 0.01% to 0.001%. Such reflectivities can be implemented by a combination of: (1) a method of applying antireflection (AR) film coatings on the facets of the n-type InP substrate 26; (2) a method of forming window structures for reducing substantial facet reflection by burying an AR film coating material in the substrate in a manner keeping away from the facets of the optical waveguides which will serve as an active layer; and (3) a method of effectively reducing facet reflection by arranging the optical waveguides obliquely with respect to the corresponding facets. These methods are described, e.g., on pp. 618–622 of "Optics" (Vol. 25) published by the Japan Society of Applied Physics in 1996.

The demultiplexer 4 has an arrayed waveguide diffraction grating structure described, e.g., on pp. 418–423 of "Optics" (Vol. 26, No. 8) published by the Japan Society of Applied Physics in 1997, and comprises a first slab waveguide 17a optically coupled to the input waveguide 3, a waveguide array 18a optically coupled to the first slab waveguide 17a, and a second slab waveguide 19a optically coupled to the waveguide array 18a. The second slab waveguide 19a is optically coupled to the output waveguide 5.

The multiplexer 11 is a reversed version of the demultiplexer 4 in terms of how its components are arranged, and thus comprises a second slab waveguide 19b optically coupled to the input waveguide 9, a waveguide array 18b optically coupled to the second slab waveguide 19b, and a first slab waveguide 17b optically coupled to the waveguide array 18b. The first slab waveguide 17b is optically coupled to the output waveguide 12.

In a semiconductor optical amplifier 40 according to the first embodiment, to amplify an optical signal containing a plurality of different wavelength components, the number of demultiplexed signals produced by the demultiplexer 4 (the number of waveguides in the waveguide array 18a), the number of waveguides in the output waveguide 5, the number of optical amplifiers in the amplifying unit 7, the number of waveguides in the input waveguide 9 and the number of demultiplexed signals to be combined in the multiplexer 11 (the number of waveguides in the waveguide array 18b) are equal to N (N being a positive integer). The waveguide arrays 18a and 18b may have a larger number of waveguides than the number (N) of demultiplexed signals produced by the demultiplexer 4.

Figure 11A:
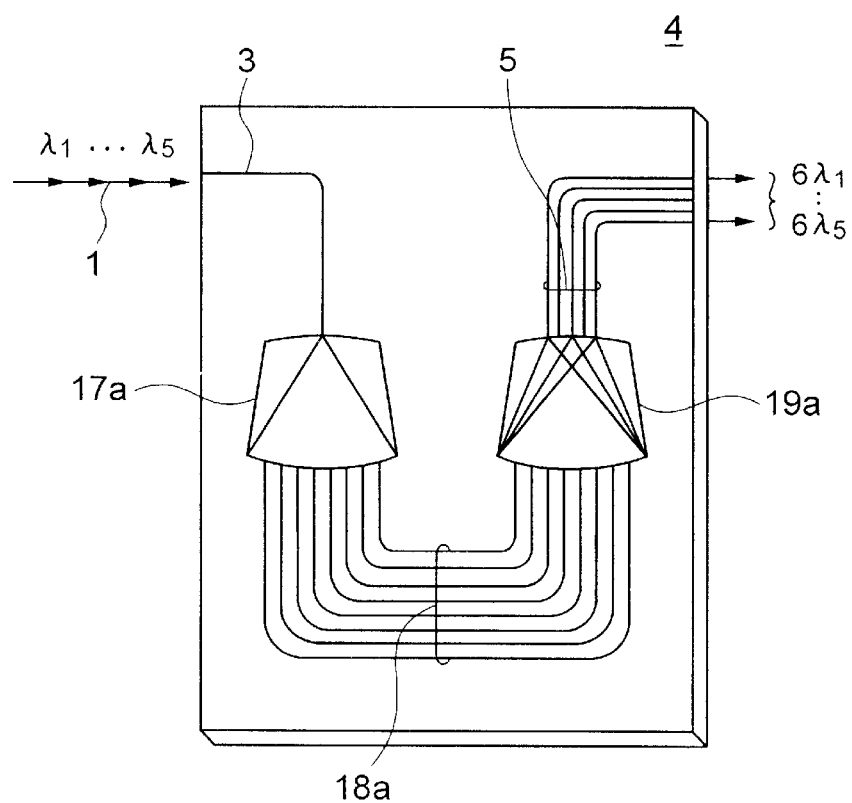
FIGS. 11A to 11C are schematic plan views showing a demultiplexer appearing in the same semiconductor optical amplifier module.
Figure 11B:
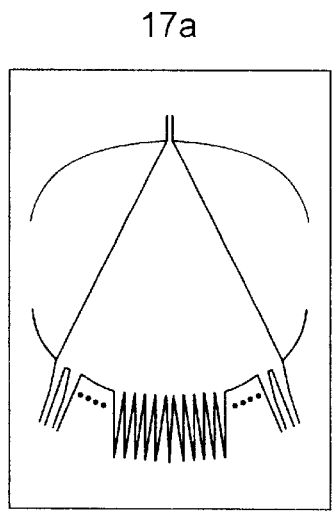
Figure 11C:
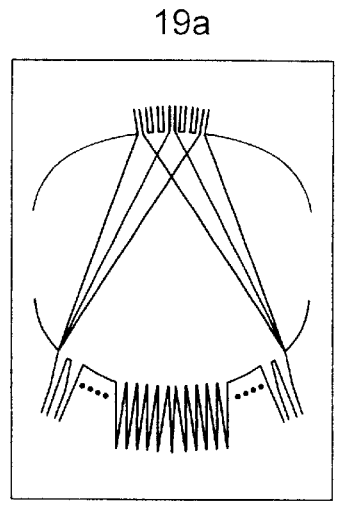

Here we describe the demultiplexer 4 with reference to the schematic diagrams of FIGS. 11A to 11C, in which the number N of demultiplexed signals is five (5). In the demultiplexer 4 shown in FIG. 11A, an optical input signal 1 incident from one end of the input waveguide 3 spreads by diffraction within the input (first) slab waveguide 17a, and is distributed to the waveguide array 18a at the same phase. Each of the distributed optical signal components is given a phase difference corresponding to a waveguide length difference $\Delta L$ (the lengths of adjacent waveguides differ by $\Delta L$) when propagating through a corresponding one of the waveguides in the waveguide array 18a. Thereafter, these optical signal components interfere with one another along the output (second) slab waveguide 19a to concentrate at the output waveguide 5. Since the phase differences given these optical signal components by the waveguide array 18a differ according to their wavelength, these optical signal components concentrate at the five (5) waveguides in the output waveguide 5 and then exit therefrom as demultiplexed signals $6\lambda_1$, $6\lambda_2$ . . . $6\lambda_5$.

FIG. 11B is an enlarged view of the input slab waveguide 17a which performs demultiplexing. FIG. 11C is an enlarged view of the output slab waveguide 19a which performs multiplexing. Although the demultiplexer 4 receives an optical signal containing the wavelength components $\lambda_1$–$\lambda_5$ from one end of the input waveguide 3 and transmits five (5) demultiplexed signals respectively having the wavelength components $\lambda_1$, $\lambda_2$ . . . $\lambda_5$ from one end of the output waveguide 5, the demultiplexer 4 can be used as a multiplexer when it is arranged to receive five (5) demultiplexed signals from the same end of the output waveguide 5 and transmit an optical signal containing the five (5) wavelength components from the same end of the input waveguide 3.

The multiplexer 11 employed in the first embodiment is a reversed version of the demultiplexer 4 in terms of how its components are arranged. Therefore, in the multiplexer 11, the input waveguide 3 serves as the output waveguide and the output waveguide 5 as the input waveguide.

As shown in FIG. 1, the optical amplifying unit 7 includes a plurality of optical amplifiers which are arranged in parallel between the demultiplexer 4 and the multiplexer 11. These optical amplifiers are optically coupled at one end thereof to the output waveguide 5 which is coupled to the second slab waveguide 19a of the demultiplexer 4, and at the other end thereof to the input waveguide 9 which is coupled to the second slab waveguide 19b of the multiplexer 11.

The optical amplifying unit in the first embodiment can amplify an optical signal containing as many as, e.g., 100 to 1000 wavelength components or more by selecting the number of waveguides and amplifiers which perform demultiplexing, amplification, and multiplexing accordingly.

In the semiconductor optical amplifier module 40 according to the first embodiment, the optical input signal 1 containing the plurality of wavelength components $\lambda_1$–$\lambda_N$ incident from the antireflection input facet 2, which is one end of the input waveguide 3, is separated by the demultiplexer 4 into signals each having a different one of the wavelength components (demultiplexed signals), and each demultiplexed signal is amplified by a corresponding one of the optical amplifiers in the optical amplifying unit 7. Then, the amplified demultiplexed signals are combined again by the multiplexer 11 into an amplified optical output signal 14 containing the plurality of wavelength components $\lambda_1$–$\lambda_N$, and the signal 14 then exits from the antireflection output facet 13, which is one end of the output waveguide 12.

Next, we describe how the semiconductor optical amplifier module 40 according to the first embodiment performs amplifying operation with reference to FIGS. 3 to 5 and FIGS. 11A to 11C. The following description is based on the assumption that the optical input signal 1 contains the wavelength components $\lambda_1$–$\lambda_5$. As shown in FIGS. 11A to 11C, the optical input signal 1 incident from one end of the input waveguide 3 spreads by diffraction within the first slab waveguide 17a, and is distributed to the waveguide array 18a at the same phase. Each of the distributed optical signal components is given a phase difference corresponding to a waveguide length difference $\Delta L$ when propagating through a corresponding one of the waveguides in the waveguide array 18a. Thereafter, these optical signal components interfere with one another along the second slab waveguide 19a to concentrate at the output waveguide 5 as the five (5) demultiplexed wavelength signals $6\lambda_1$–$6\lambda_5$.

The demultiplexed signals $6\lambda_1$–$6\lambda_5$ having different wavelength components which are obtained while separated by the demultiplexer 4 are amplified by the optical amplifiers 71–75, respectively, as shown in FIG. 3. For the amplification, a dc current power supply 8 supplies a current to the optical amplifiers 71–75 so that the amplifiers 71–75 can obtain certain gains.

Figure 4:
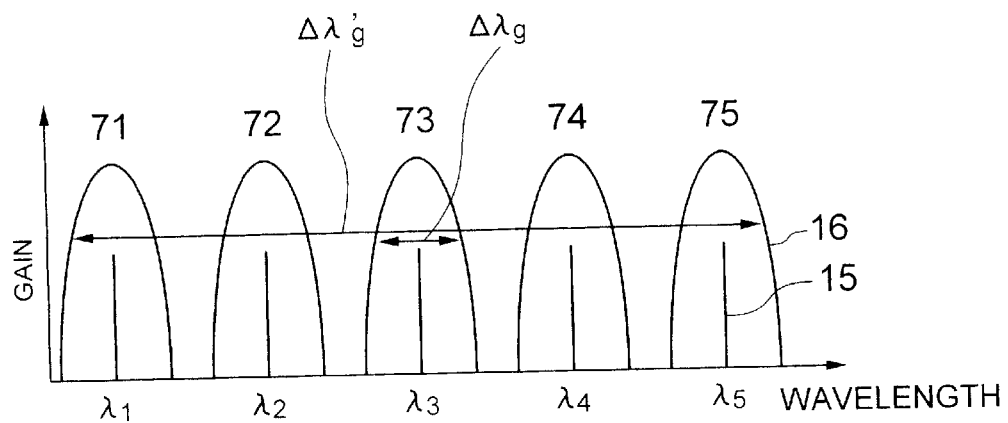
FIG. 4 is a diagram showing gain spectra of semiconductor optical amplifiers in the same semiconductor optical amplifier module.

FIG. 4 shows the positional relationship among the gain wavelength bands of the respective optical amplifiers 71–75. Here, their gain wavelengh bands are defined by changing as necessary the band gap wavelengths of the respective optical amplifiers so as to amplify the incident demultiplexed signals $6\lambda_1$–$6\lambda_5$. The term "the band gap wavelength of an amplifier" means its maximum wavelength having a gain. That is, as shown in FIG. 4, the demultiplexed signal $6\lambda_1$ having the wavelength $\lambda_1$ is amplified by the optical amplifier 71 having a gain wavelength band containing this wavelength, and the demultiplexed signal $6\lambda_2$ having the wavelength $\lambda_2$ is amplified by the optical amplifier 72 having a gain wavelength band containing this wavelength. Similarly, the demultiplexed signals $6\lambda_3$, $6\lambda_4$, and $6\lambda_5$ having the wavelengths $\lambda_3$, $\lambda_4$, and $\lambda_5$ are amplified by the optical amplifiers 73, 74, and 75 having gain wavelength bands containing these wavelengths $\lambda_3$, $\lambda_4$, $\lambda_5$, respectively.

In this case, each of the optical amplifiers 71–75 may not necessarily have a different gain wavelength band (a different band gap wavelength) as shown in FIG. 4. For example, if the optical amplifier 71 has a gain wavelength band containing not only the wavelength $\lambda_1$ but also the wavelength $\lambda_2$, then the optical amplifiers 71 and 72 may have the same construction. However, these optical amplifiers must be spatially separated (they must be arranged physically independently). Thus, the wavelength-multiplexed signal 1 containing a plurality of different wavelength components is separated to produce spatially separated demultiplexed signals each having a different one of the wavelength components, and these demultiplexed signals are amplified respectively by independent optical amplifiers each having a gain wavelength band containing a corresponding one of the wavelength components. As a result, even if a gain wavelength bandwidth $\Delta\lambda_g$ of each of the optical amplifiers 71–75 is limited, it is possible that the effective gain wavelength bandwidth $\Delta\lambda_g'$ of the amplifying unit 7 will greatly exceed the gain wavelength bandwidths $\Delta\lambda_g$ (see FIG. 4).

Figure 9A:
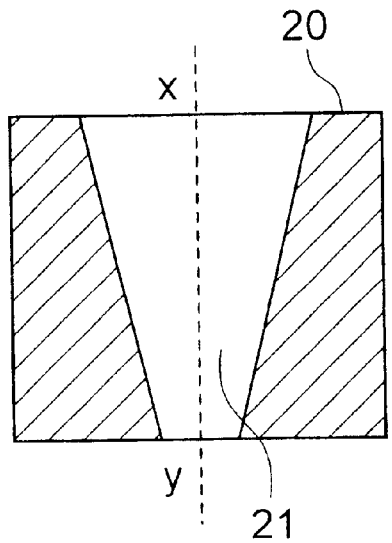
FIGS. 9A and 9B are schematic diagrams showing an exemplary technique of forming a quantum well layer with its thickness varied in a tapered manner in the preparation step shown in FIG. 8B.
Figure 9B:
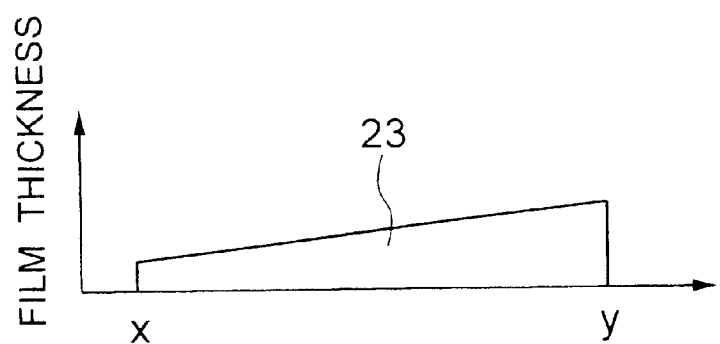

We now describe a method of implementing semiconductor optical amplifiers each having a different gain wavelength band such as shown in FIG. 4. This method is based on a selective-area metal-organic vapor-phase epitaxy (selective-area MOVPE) ("MICROWAVE AND OPTICAL TECHNOLOGY LETTERS/Vol. 7, No. 3, Feb. 20, 1994, pp. 132–139). A quantum well layer is formed in a manner that its quantum well width vary spacewise, and the resultant layer portions each having a different width are separated spacewise. We describe the selective-area MOVPE with reference to FIGS. 9A and 9B. As shown in FIG. 9A, an $SiO_2$ film 20 is selectively formed on a semiconductor substrate. For example, a tapered $SiO_2$ mask 20 is formed, which includes a tapered pattern such that a strip-like pattern having no $SiO_2$ film 20 formed thereon has its width gradually increasing or decreasing along its length. Thereafter, when growing a crystal at a crystal face 21 of the semiconductor substrate which is exposed between portions of the tapered $SiO_2$ mask 20, no crystal grows on the $SiO_2$ film 20, and the crystal growth material which has not been consumed for the crystal growth contributes, in the end, to a crystal growth on the exposed portion, and thus the crystal is grown thick where the width of the exposed portion is narrow, and thin where the width of the exposed portion is wide. That is, the film thickness of a grown crystal 23 between the $SiO_2$ mask portions is inversely proportional to the width of the $SiO_2$ mask. When the tapered mask 20 shown in FIG. 9A is used, the grown crystal 23 has its film thickness varied spacewise in a tapered manner as shown in FIG. 9B.

Figure 10A:
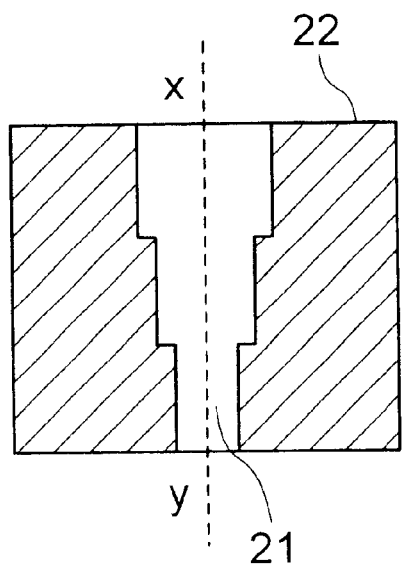
FIGS. 10A and 10B are schematic diagrams showing another exemplary technique of forming a quantum well layer with its thickness varied stepwise in the preparation step shown in FIG. 8B.
Figure 10B:
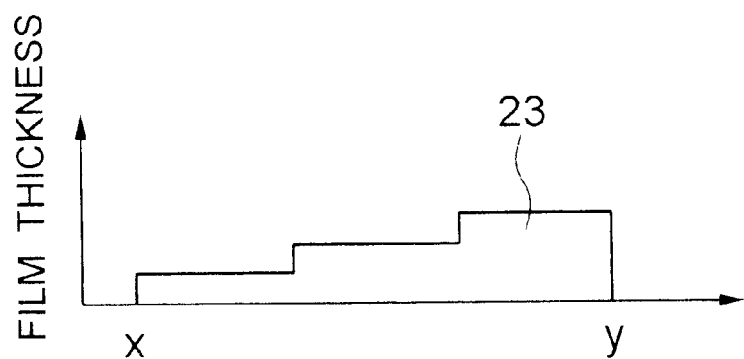

When a stepped $SiO_2$ mask 22 such as shown in FIGS. 10A and 10B is used, i.e., when a mask so patterned that the width of the exposed crystal varies stepwise is used, the grown crystal 23 has its film thickness varied step by step spacewise as shown in FIG. 10B.

Thus, the selective-area MOVPE is utilized to form the quantum well layer of the semiconductor optical amplifiers in a manner that its quantum well width varies spacewise. Such a quantum well layer having spacewise-varied quantum well widths is then separated spacewise (electrically) to form the optical amplifying unit 7 for amplifying corresponding demultiplexed signals, respectively.

Figure 6:
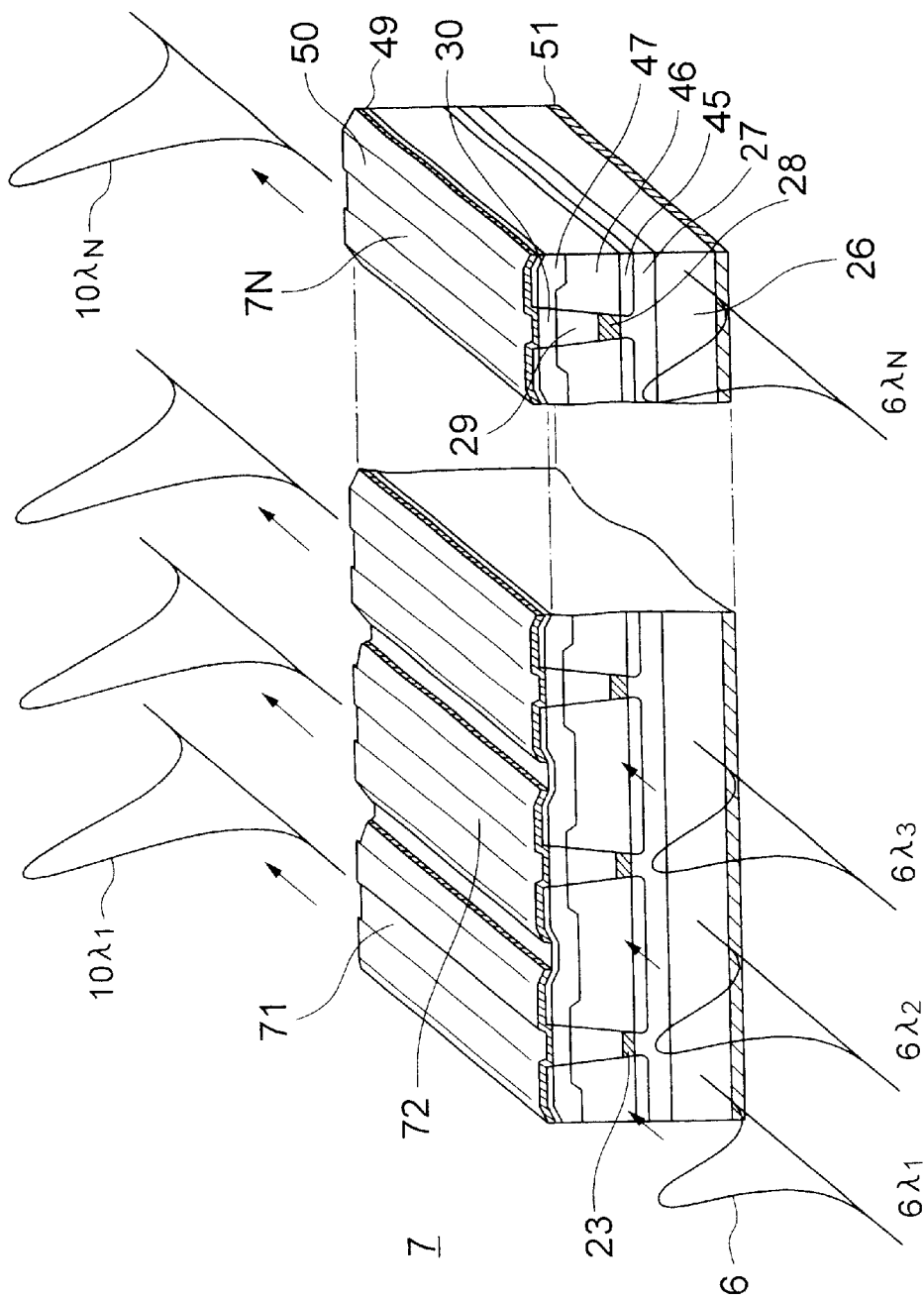
FIG. 6 is a schematic perspective view of a semiconductor optical amplifying unit in the same semiconductor optical amplifier module.

FIG. 6 is a schematic sectional view of the optical amplifying unit 7 in which N optical amplifiers 71–7N for amplifying demultiplexed signals each having a different one of the wavelength components $\lambda_1$–$\lambda_N$ are arranged in parallel. The dc current power supply is connected to all the electrodes of the optical amplifiers 71–7N, and population inversion is caused in the quantum well layer through current injection to obtain optical gains. The optical signal 1 is separated into signal components having $\lambda_1$–$\lambda_N$, i.e., demultiplexed signals $6\lambda_1$–$6\lambda_N$, and these demultiplexed signals $6\lambda_1$–$6\lambda_N$ enter the optical amplifiers 71–7N and exit from the optical amplifiers 71–7N as amplified demultiplexed signals $10\lambda_1$–$10\lambda_N$, respectively.

Figure 7:
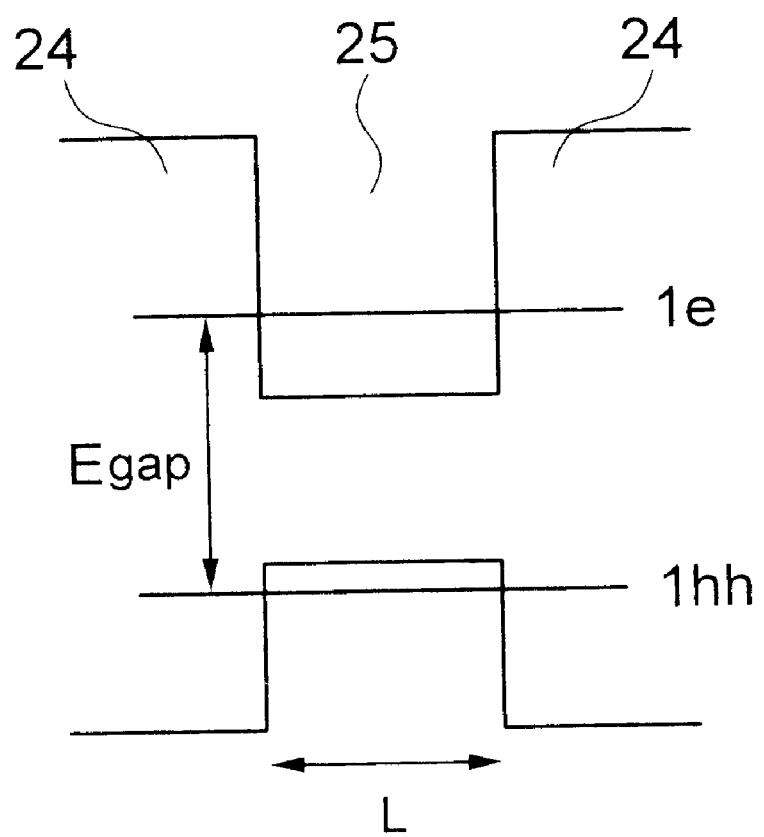
FIG. 7 is an electronic potential energy diagram of a semiconductor quantum well structure of the semiconductor optical amplifiers used in embodiments of the present invention.

Here, assuming that an active layer forming the optical amplifiers 71–7N has an InGaAs/InP quantum well structure, let us estimate the effective gain wavelength bandwidth $\Delta\lambda_g'$. FIG. 7 shows the electronic potential energy diagram of a quantum well structure. Let us think about a quantum well structure composed of an InP barrier layer 24 and an InGaAs quantum well layer 25. For example, when the quantum well width L changes from 5 nm to 20 nm, we found that the band gap wavelength $\lambda_{gap}$ of a gain spectrum defined by an energy difference $E_{gap}$ between the lowest subband level 1e of electrons and the lowest level 1hh of heavy holes changes by about 800 nm. One can obtain $\lambda_{gap}$ by using an equation $\lambda_{gap}=ch/E_{gap}$ (where c is the velocity of light, and h is the Planck's constant). Therefore, we found that an optical amplifying unit having a gain wavelength bandwidth of about 800 nm can be obtained by the above-mentioned method.

Figure 5:
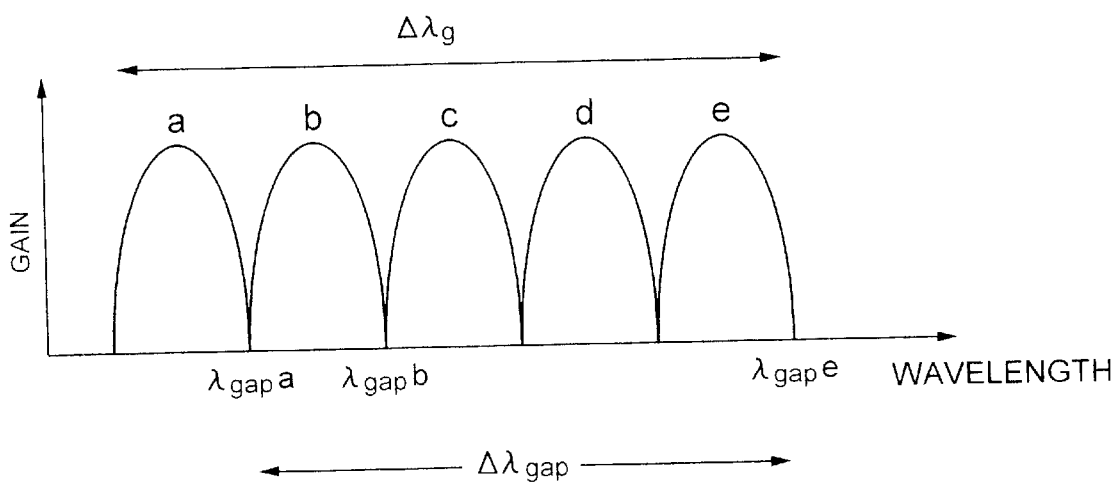
FIG. 5 is a diagram showing gain spectra for illustrating gain spectrum widths of the same semiconductor optical amplifiers.

Here we describe the gains with reference to FIG. 5. Reference characters a to e in FIG. 5 denote gain spectra corresponding to quantum wells each having a different thickness. Let it be assumed that the gain spectrum a has a quantum well width L of 5 nm, the gain spectrum e has a quantum well width L of 20 nm, and each of the gain spectra b to d has a quantum well width of 5 nm<L<20 nm. Reference characters $\lambda_{gap}^a$–$\lambda_{gap}^e$ denote band gap wavelengths of the gain spectra with respect to the respective quantum well widths. Since a calculated difference between $\lambda_{gap}^a$ and $\lambda_{gap}^e$ is about 800 nm (=$\Delta\lambda_{gap}$) the gain spectrum width $\Delta\lambda_g$ in this case exceeds 800 nm ($\Delta\lambda_g$>$\Delta\lambda_{gap}$).

As shown in FIG. 6, the respective optical amplifiers have the same construction for their components except that their quantum well widths forming the active layer are different (e.g., the multiple-quantum-well (MQW) active layer has varied thicknesses). The MQW active layer having varied thicknesses can be formed by the above-mentioned preparation method shown in FIGS. 9A and 9B or FIGS. 10A and 10B. In FIGS. 9B and 10B, the thickness of an InGaAsP MQW layer (active layer) 28 increases as it extends rightward.

Figure 8A:
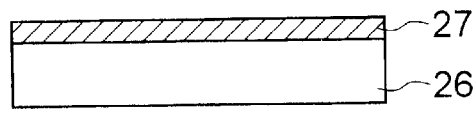
FIGS. 8A to 8E are sectional views showing preparation steps for the semiconductor optical amplifying unit used in the embodiments of the present invention.

We now describe the structure of the optical amplifying unit 7 with reference to the method of preparing the optical amplifiers and the like shown in FIG. 6 and FIGS. 8A to 8E. As shown in FIG. 8A, the substrate 26 is initially prepared. The substrate 26 is, e.g, an n-type InP substrate having a (100) plane for forming the optical amplifying unit 7, the demultiplexer 4, the multiplexer 11, and the like. Its forbidden band wavelength $\lambda_g$ is 0.92 µm, and its donor concentration $N_D$ is $2\times10^{18}$ cm$^{-3}$.

The demultiplexer 4 and the multiplexer 11 are formed on this substrate (n-type InP substrate) 26 using a (1×N) InGaAsP arrayed waveguide diffraction grating (not shown). That is, an $SiO_2$ mask layer is deposited on a region for forming the optical amplifying unit 7, and then an InGaAsP layer is formed by a metal-organic vapor phase epitaxy (MOVPE) on the (100) plane which is on the side of the exposed portion of the n-type InP substrate 26. Thereafter, the InGaAsP layer is patterned to form the (1×N) arrayed waveguide diffraction grating. Further, the InGaAsP layer and the like are covered with an $SiO_2$ film to form the demultiplexer 4 and the multiplexer 11. During this process, the optical waveguides, which are optically coupled mutually to the demultiplexer 4, the optical amplifying unit 7, and the multiplexer 11, i.e., the input waveguide 3, the output waveguide 5, the input waveguide 9, and the output waveguide 12 are also formed at the same time. Sill further, the facets through which an optical signal enters or exits are subjected to an antireflection coating process to form the antireflection input facet 2 and the antireflection output facet 13. An example of this coating process involves the steps of dicing the substrate 26 in all directions into semiconductor optical amplifier module elements (chips), and then applying antireflection coatings to the side surfaces of each chip. Further, as mentioned before, the antireflection film coatings can be formed by a combination of (1) a method of applying antireflection (AR) film coatings on the facets of the n-type InP substrate 26; (2) a method of forming window structures for reducing substantial facet reflection by burying an antireflection coating material in the substrate in a manner keeping away from the facets of the optical waveguides which will become the active layer; and (3) a method of effectively reducing facet reflection by arranging the optical waveguides obliquely with respect to the corresponding facets. Through the combination of these methods, one can implement low reflectivities ranging from 0.01% to 0.001%.

Next, after removing the mask layer on the n-type InP substrate 26, an $SiO_2$ mask layer is formed on the substrate 26 excluding the region for forming the optical amplifying unit 7. Thereafter, as shown in FIG. 8A, an undoped InGaAsP clad layer 27 is formed on the substrate 26 by the MOVPE method. The InGaAsP clad layer 27 has a forbidden band wavelength $\lambda_g$ of 1.1 μm and a thickness of 0.5 μm.

Figure 8B:
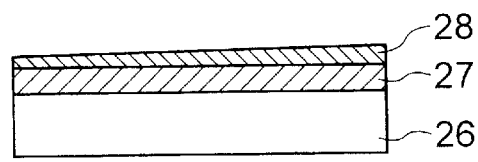

Next, as shown in FIG. 8B, the InGaAsP MQW layer 28, in which the thickness of the quantum well layer varies spacewise in a tapered fashion, is formed by selective-area MOVPE. This can vary the band gap for the gain wavelength band for the optical amplifiers in the optical amplifying unit 7 spacewise. As already illustrated with reference to FIGS. 10A and 10B, the thickness of the quantum well layer may be varied in a stepped manner.

Figure 8C:
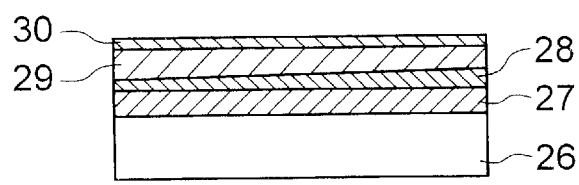

Next, as shown in FIG. 8C, after growing the InGaAsP MQW layer 28 for the respective amplifiers, formed sequentially on the layer 28 are an undoped InP clad layer 29 (forbidden band wavelength $\lambda_g=1.1$ μm, thickness=0.5 μm) and a p-InGaAsP cap layer 30 ($\lambda_g=0.92$ μm, acceptor concentration $N_A=5\times10^{18}$ $cm^{-3}$, thickness=0.1 μm).

Figure 8D:
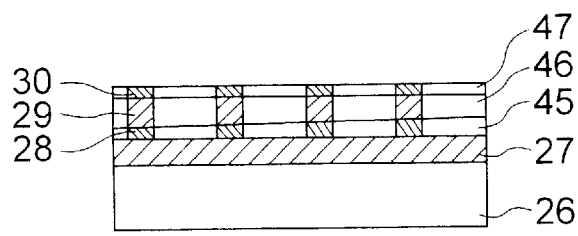
Figure 8E:
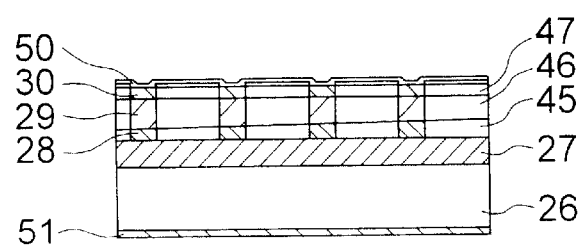

Next, as shown in FIG. 8D, after forming an etching mask (not shown) on the p-InGaAsP cap layer 30, grooves are formed by selectively etching the layer 30 in a manner reaching the surface of the InGaAsP clad layer 27. Thereafter, a p-InP block layer 45, an n-InP burying layer 46, and an n-InGaAsP cap layer 47 are sequentially formed within each etched groove. In addition, by covering the n-InGaAsP cap layer 47 with an insulating film 49 (see FIG. 6), positive electrodes 50 for the optical amplifiers are formed on the exposed striped p-InGaAsP cap layer 30 and on part of portions of the insulating film 49 on both sides of the layer 30 as shown in FIGS. 8E and 6. Further, a negative electrode 51 serving as a common electrode is formed on the other surface of the n-type InP substrate 26. The positive electrodes 50 are formed by vapor-depositing Au/AuZn layers, while the negative electrode 51 is formed by vapor-depositing AuGeNi/Au layers.

Such a semiconductor optical amplifier module 40 is used while incorporated into a predetermined existing package and optically coupled to a trunk-line optical fiber.

The optical input signal 1 incident from the antireflection input facet 2 enters the multiplexer 4 via the input waveguide 3. At the demultiplexer 4, the first slab waveguide 17a and the waveguide array 18a spread the incident signal 1, and the second slab waveguide 19a separates it into N demultiplexed signals $6\lambda_1$–$6\lambda_N$, which then exit from the demultiplexer 4 after distributed into the corresponding waveguides in the output waveguide 5. As a result, the demultiplexed signals $6\lambda_1$–$6\lambda_N$ are amplified by the corresponding optical amplifiers 71–7N, and the amplified demultiplexed signals then enter the second slab waveguide 19b of the multiplexer 11 via the input waveguide 9. At the multiplexer 11, the waveguide array 18b and the first slab waveguide 17b combine the amplified demultiplexed signals $6\lambda_1$–$6\lambda_N$ from the second slab waveguide 19b to produce a multiplexed signal, and the multiplexed signal is conducted to the single output waveguide 12 to exit from its antireflection output facet 13.

The semiconductor optical amplifier module 40 according to the first embodiment is used as amplifiers for repeaters in an optical communication system. FIG. 2 is a schematic diagram outlining an optical communication system. Optical signals $62\lambda_1$–$62\lambda_N$ transmitted from terminals 61 of a transmitter 60 are combined by a WDM multiplexer 63 to produce a single multiplexed signal 62a, and the multiplexed signal 62a is transmitted by a single optical fiber 64a. At a repeating point, the semiconductor optical amplifier module 40 incorporated in a repeater 65 amplifies the wavelength components $\lambda_1$–$\lambda_N$ contained in the multiplexed signal 62a, and the amplified multiplexed signal 62b is transmitted through a single optical fiber 64b to reach a receiver 66. At the receiver 66, a WDM demultiplexer 67 separates the amplified multiplexed optical signal 62b again to be distributed into terminals 68 as amplified demultiplexed signals $67\lambda_1$–$67\lambda_N$. This can implement a WDM communication system. Although FIG. 2 shows an example in which only one repeater 65 is arranged along the optical transmission path has been presented, a number of repeaters 65 may, of course, be arranged as necessary when the optical transmission path is long.

The first embodiment will provide the following advantages:

(1) The semiconductor optical amplifier module can provide a gain wavelength band as broad as about 80 nm to 800 nm, and hence can effect wavelength multiplexing for as many as 100 to 1000 wavelength components on a practical basis. That is, the semiconductor optical amplifier module according to the first embodiment can increase the gain wavelength band of the optical amplifying unit remarkably.

(2) The semiconductor optical amplifier module has a structure in which an input waveguide, a demultiplexer, an output waveguide, optical amplifiers, an input waveguide, a multiplexer, and an output waveguide are incorporated monolithically onto the surface of a single substrate. Therefore, the semiconductor optical amplifier module can be implemented by a size-reduced element, and hence can provide small size optical amplifiers for repeaters.

(3) The semiconductor optical amplifier module according to the first embodiment amplifies each demultiplexed signal in a spatially separated, different optical amplifier region, and hence can prevent gain saturation. That is, when a wavelength-multiplexed signal is spatially separated and the spatially separated signals enter different optical amplifier regions, respectively, optical power entering each optical amplifier region can be reduced to such an extent as not to cause gain saturation. As a result, the input light only can reduce the carrier density of the active layer to a lesser degree, which in turn prevents gain reduction derived from gain saturation.

(4) The semiconductor optical amplifier module according to the first embodiment amplifies each demultiplexed signal in a spatially separated, different optical amplifier region, and hence can prevent four wave mixing. That is, when a wavelength-multiplexed signal is spatially separated and such spatially separated signals enter into different optical amplifier regions, respectively, no two spatially separated signals enter the same optical amplifier region. As a result, four wave mixing due to interaction between wavelength components is hard to occur.

(5) The optical communication system (WDM communication system) incorporating the semiconductor optical amplifier module according to the first embodiment provides a gain wavelength bandwidth as broad as 80 nm to 800 nm, and hence can implement WDM communications dealing with as many as 100 to 1000 optical signals each having a different wavelength.

(6) The optical communication system (WDM communication system) incorporating the semiconductor optical amplifier module according to the first embodiment provides a gain wavelength band as broad as 80 nm to 800 nm, and hence can not only implement WDM communications dealing with as many as 100 to 1000 optical signals each having a different wavelength, but also improve communication reliability owing to the fact that gain saturation and four wave mixing are hard to occur.

Second Embodiment

Figure 12A:
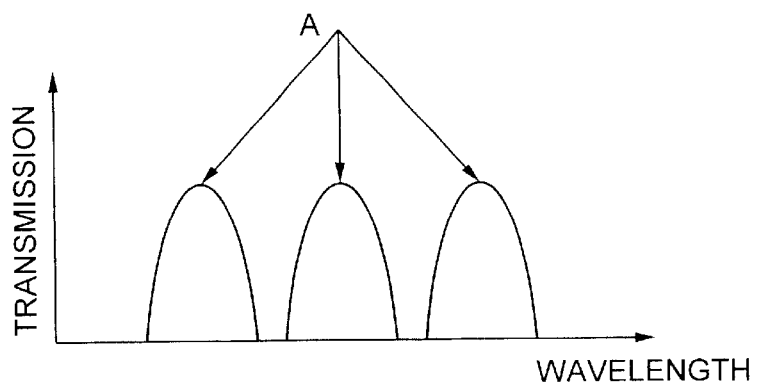
FIGS. 12A to 12C are diagrams showing transmission spectra of semiconductor optical amplifiers in a semiconductor optical amplifier module which is a second embodiment of the present invention.
Figure 12B:
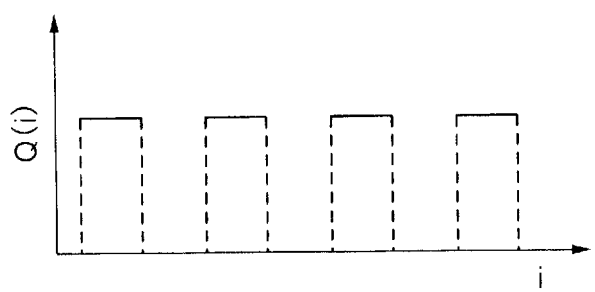
Figure 12C:
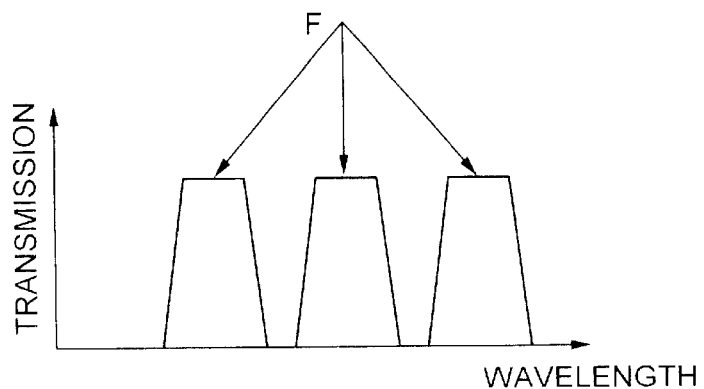

FIGS. 12A to 12C are diagrams illustrating transmission spectra of a demultiplexer/multiplexer in a semiconductor optical amplifier module which is a second embodiment of the present invention. To obtain a flatter gain spectrum width, the second embodiment employs an arrayed waveguide diffraction grating whose structure is different from that of the arrayed waveguide diffraction grating employed in the first embodiment. In the first embodiment, an optical path-length difference $\Delta L$ between adjacent arrayed optical waveguides in the arrayed waveguide diffraction grating is fixed. In this case, no flat spectrum is obtained for each of channels in the arrayed waveguide diffraction grating.

To make the transmission spectra flatter, appropriate optical path-length differences are added to $\Delta L$ in the second embodiment.

Generally, the waveguide length L(i) (i is an integer, which is an exponent of a waveguide) of each of the arrayed waveguides 18 and the second slab waveguides 19 in the demultiplexer 4 and the multiplexer 11 is given by
[Expression 1]

$$L(i) = L_c + \Delta L \times (i-1)$$

(where $L_c$ is the minimum waveguide length). That is, the path-length difference between adjacent waveguides is fixed to $\Delta L$. In this case, each transmission spectrum of the arrayed waveguide diffraction grating is not flat, but depicts a parabolic line A, as shown in FIG. 12A.

However, when Q(i) such as shown in FIG. 12B is added to L(i),
[Expression 2]

$$L(i) = L_c + \Delta L \times (i-1) + Q(i)$$

Then, one can obtain flat transmission spectra such as shown in FIG. 12C.

The specific shape of Q(i), i.e., the width and height of the solid line portion depends on the structure of the waveguide array, or mainly on the physical length of each waveguide, and can be determined by calculation. Thus, one may select these dimensions as appropriate. Note that a technique for obtaining flatter transmission spectra such as above is described on, e.g., pp. 43–45 of OPTICS LETTERS (Vol. 20, 1995).

Flat transmission spectra can be obtained using this technique. Therefore, since the shape of a gain spectrum width of each optical amplifier (semiconductor optical amplifier module) of the present invention is determined by the transmission spectra of the arrayed waveguide diffraction grating, broad band semiconductor optical amplifiers (semiconductor optical amplifier module) having flat gain spectra can be implemented.

Third Embodiment

Figure 13:
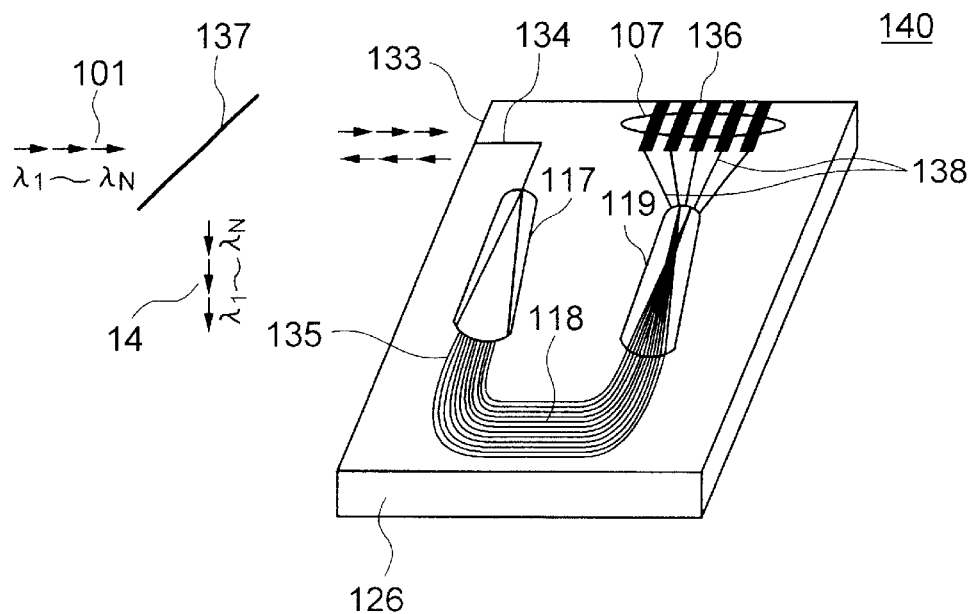
FIG. 13 is a schematic perspective view of a downsized semiconductor optical amplifier module which is a third embodiment of the present invention.

FIG. 13 is a schematic perspective view of a downsized semiconductor optical amplifier module which is a third embodiment of the present invention. In the third embodiment, to reduce the element size, a semiconductor optical amplifier module 140 comprises a demultiplexer/multiplexer 135 and a reflector. The demultiplexer/multiplexer 135 uses a single arrayed waveguide diffraction grating serving both as a demultiplexer and a multiplexer and is placed between an input/output optical waveguide 134 and an optical amplifying unit 107 including a plurality of optical amplifiers. The reflector is provided on an output facet from which optical signals amplified by the optical amplifying unit 107 exit.

That is, the demultiplexer/multiplexer 135 formed on the surface of a substrate 126 is optically coupled to a first slab waveguide 117, an arrayed waveguide 118, and a second slab waveguide 119 in succession. The first slab waveguide 117 is optically coupled to the input/output optical waveguide 134, and the second slab waveguide 119 is optically coupled to a plurality of input/output waveguides 138. The input/output optical waveguides 138 are optically coupled to one end of the optical amplifying unit 107. The other end of the unit 107 provides a high-reflection facet 136, which is a reflecting mirror.

An optical input signal 101 containing a plurality of different wavelength components $\lambda_1-\lambda_N$ enters the input/output optical waveguide 134 first via a beam splitter 137 and then via an antireflection input/output facet 133 of the waveguide 134, and is separated into N demultiplexed signals by the first slab waveguide 117, the waveguide array 118, and the second slab waveguide 119 of the demultiplexer/multiplexer 135. Thereafter, these demultiplexed signals are conducted to the input/output optical waveguides 138 to enter the optical amplifying unit 107, where they are amplified by optical amplifiers 1071–107N, respectively. The amplified demultiplexed signals are reflected by the high-reflection facet 136 to go back through the optical amplifying unit 107 again while being amplified thereby, and then pass through the input/output optical waveguides 138 to reach the demultiplexer/multiplexer 135, where these amplified returning signals are combined by the second slab waveguide 119, the waveguide array 118, and the first slab waveguide 117 to produce a multiplexed, single amplified optical signal. Such a multiplexed, single amplified optical signal then exits from the antireflection input/output facet 133 of the input/output optical waveguide 134. The exiting amplified optical signal contains the plurality of wavelength components $\lambda_1-\lambda_N$ which are contained in the input signal 101, and passes through the beam splitter 137 to be oriented in a direction different from the incident direction of the input signal 101 and thus received by an optical fiber (not shown) as an amplified output signal 114.

The high-reflection facet 136 which is the reflecting mirror is formed by coating a $Si/SiO_2$ multilayered film on a side surface of the substrate 126. The thicknesses of the Si layer and the SiO$_2$ layer are set to $\lambda/4n$, where $\lambda$ is the center wavelength of each of the wavelength components $\lambda_1$–$\lambda_N$, and n is the refractive index of each of these layers. A total of twenty (20) layers (ten pairs) would implement a reflectivity of 0.9 or more. The reflectivity can be increased approximately to 1.0 by increasing the number of layers (pairs).

The semiconductor optical amplifier module 140 according to the third embodiment implements an element with its dimensions significantly reduced (about half the size of the element according to the first embodiment), and hence can implement a small size semiconductor optical amplifier module as packaged, which in turn allows repeaters to be downsized as well.

Figure 14:
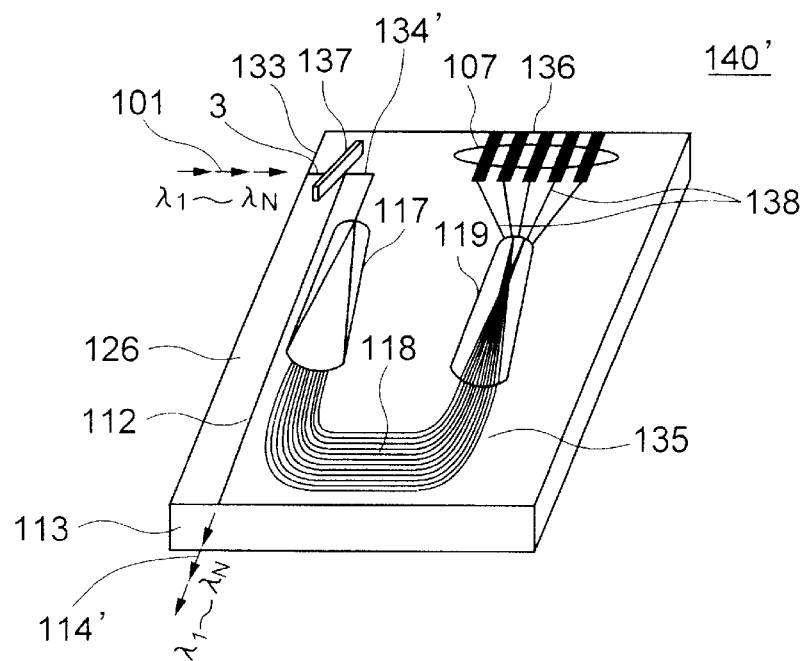
FIG. 14 is a schematic perspective view showing a modified example of the semiconductor optical amplifier module according to the third embodiment.

FIG. 14 is a schematic perspective view showing a modified example of the semiconductor optical amplifier module according to the third embodiment. The modified example is distinguished from the semiconductor optical amplifier module according to the third embodiment in that its beam splitter is incorporated into the substrate. That is, in the modified example, a groove or slit-like recess is formed in the surface of the substrate 126 in a manner crossing the input/output optical waveguide 134 (e.g., crossing at 45°), and the beam splitter 137 is inserted into such a groove or recess. FIG. 14 shows an example in which the beam splitter 137 is fitted into a recess. By adopting such a structure, the optical waveguide extending from the antireflection input/output facet 133 to the beam splitter 137 serves as an input waveguide 134', and the optical signal 101 entering via the input waveguide 134' directly passes through the beam splitter 137. However, an amplified optical signal 114' returning via the input/output optical waveguide 134 which is optically coupled to the first slab waveguide 117 of the demultiplexer/multiplexer 135 is reflected by the beam splitter 137 to change its optical path. In this modified example, the output waveguide 112 is arranged along this optical path. The output waveguide 112 has an antireflection output facet 113. Therefore, the amplified output signal 114' which has been reflected by the beam splitter 137 contains the same plurality of wavelength components $\lambda_1$–$\lambda_N$ as those contained in the input signal 101, and passes through the output waveguide 112 to exit from the antireflection output facet 113. The output signal 114' enters a light-transmitting optical fiber which is not shown.

This modified embodiment features the beam splitter 137 which is monolithically incorporated into the substrate 126, and hence can implement a semiconductor optical amplifier module 140' which is further downsized than the module 140 according to the third embodiment.

While the invention made by the present inventors has been described above with reference to the specific embodiments, the present invention is not limited to these embodiments, but may, of course, be modified in various ways without departing from its spirit and scope.

Each of the embodiments of the present invention provides at least one of the following advantages and/or the above-mentioned other advantages.

(1) The arrayed waveguide diffraction grating performs demultiplexing and multiplexing, and the independent semiconductor optical amplifiers amplify the demultiplexed signals, respectively. This implements a gain spectrum width exceeding the limits of a semiconductor material, and hence can improve the gain wavelength bandwidths of the conventional semiconductor optical amplifiers remarkably.

(2) A wavelength-multiplexed signal is spatially separated, and such spatially separated signals having different wavelength components enter the independent semiconductor optical amplifiers, respectively. This reduces optical power incident into each semiconductor optical amplifier to such a level as not to cause gain saturation. Therefore, the input light can no longer reduce the carrier density of the active layer to such an extent as before, which in turn prevents gain saturation and hence increases the gains.

(3) A wavelength-multiplexed signal is spatially separated, and such spatially separated signals having different wavelength components enter the independent semiconductor optical amplifiers, respectively. This does not permit two or more spatially separated signals having different wavelength components to enter the same semiconductor optical amplifier, and hence can prevent the nonlinear optical effects of four wave mixing caused due to interaction between the wavelength components and consequently implement semiconductor optical amplifiers with better performance.

(4) The optical amplifiers are well suited for use in long-distance and short-distance, large-capacity optical communication systems such as Tbit/s-order high-density WDM communication systems.

What is claimed is:

1. A semiconductor optical amplifier module for amplifying an optical input signal having a plurality of wavelength components, comprising:

a demultiplexer arranged to receive said optical input signal, said input signal being separated by said demultiplexer into a plurality of demultiplexed signals, each of said demultiplexed signals containing a different one of said wavelength components;

a plurality of optical amplifiers optically coupled to said demultiplexer to receive said demultiplexed signals, one being provided for each of said demultiplexed signals to produce amplified demultiplexed signals; and a multiplexer arranged to receive said amplified demultiplexed signals, said amplified demultiplexed signals being combined in said multiplexer into an amplified optical output signal.

2. A semiconductor optical amplifier module according to claim 1, wherein said optical amplifiers are implemented by a multiple quantum well structure having quantum well widths ranging from a minimum value to a maximum value for providing a gain spectrum width broad enough for dealing with picture information.

3. A semiconductor optical amplifier module according to claim 2, wherein said gain spectrum width is at least 80 nm.

4. A semiconductor optical amplifier module according to claim 2, wherein said picture information is moving picture information.

5. A semiconductor optical amplifier module according to claim 1, wherein said demultiplexer includes first and second slab waveguides and a first waveguide array interconnecting said first and second slab waveguides, said input signal being spread by said first slab waveguide, conducted by said first waveguide array from said first to second slab waveguide and concentrated by said second slab waveguide to said demultiplexed signals;

said multiplexer includes third and fourth slab waveguides and a second waveguide array interconnecting said third and fourth slab waveguides, said amplified demultiplexed signals being spread by said third slab waveguide, conducted by said second waveguide array from said third to fourth slab waveguide and concentrated by said fourth slab waveguide to said amplified optical output signal;

said demultiplexer, amplifiers and multiplexer are formed with a single semiconductor substrate, said multiple well structure including a plurality of active layers having thicknesses decreasing or increasing as viewed in a direction parallel with said semiconductor substrate.

6. A semiconductor optical amplifier module for amplifying an optical input signal having a plurality of wavelength components, comprising:

a semiconductor substrate;

a demultiplexer/multiplexer formed in said semiconductor substrate including first and second slab waveguides and a waveguide array interconnecting said first and second slab waveguides;

a plurality of optical amplifiers formed in said semiconductor substrate and optically coupled to said demultiplexer/multiplexer; and a reflector formed in said semiconductor substrate to reflect outputs of said optical amplifiers back to said optical amplifiers, wherein said demultiplexer/multiplexer is arranged to receive said optical input signal, said input signal is spread by said first slab waveguide, conducted by said first waveguide array from said first to second slab waveguide and concentrated by said second slab waveguide to demultiplexed signals, whereby said input signal is separated by said demultiplexer/multiplexer into a plurality of said demultiplexed signals, each of said demultiplexed signals containing a different one of said wavelength components, said plurality of optical amplifiers are optically coupled to said second slab waveguide and to said reflector, one provided for each of said demultiplexed signals, such that each of said demultiplexed signals from said second slab waveguide is supplied to a first end of a different one of said optical amplifiers to provide an amplified demultiplexed signal and the amplified demultiplexed signal from said one amplifier is reflected by said reflector back to a second end of said one amplifier for passage therethrough, said demultiplexer/multiplexer is further arranged to receive said amplified demultiplexed signals reflected back through said optical amplifiers, said reflected demultiplexed signals being spread by said second slab waveguide, conducted by said waveguide array from said second to first slab waveguide and concentrated by said first slab waveguide to an amplified optical output signal, whereby said reflected demultiplexed signals are combined in said demultiplexer/multiplexer into the amplified optical output signal.

7. A semiconductor optical amplifier module comprising:

a demultiplexer made of a semiconductor material to separate an optical input signal containing a plurality of wavelength components into a plurality of demultiplexed signals, each of said demultiplexed signals having a different one of said wavelength components;

a plurality of semiconductor optical amplifiers each optically coupled to said demultiplexer to amplify a corresponding one of said demultiplexed signals; and a multiplexer made of said semiconductor material and optically coupled to said semiconductor optical amplifiers to combine said demultiplexed signals amplified by said semiconductor optical amplifiers into a multiplexed signal, amplify said multiplexed signal, and produce an amplified optical output signal.

8. A semiconductor optical amplifier module according to claim 7, wherein said demultiplexer, said semiconductor optical amplifiers, and said multiplexer are integrated on a single semiconductor substrate.

9. A semiconductor optical amplifier module comprising:

an optical waveguide arranged to receive at a first end thereof serving as an input/output end an optical input signal containing a plurality of wavelength components;

a demultiplexer/multiplexer optically coupled to a second end of said optical waveguide to separate said optical input signal into a plurality of demultiplexed signals, each of said demultiplexed signals having a different one of said wavelength components;

a plurality of semiconductor optical amplifiers each having a first end optically coupled to said demultiplexer/multiplexer to amplify a corresponding one of said demultiplexed signals; and a reflector arranged at a second end of each of said semiconductor optical amplifiers, said second end being an end which is not coupled to said demultiplexer/multiplexer, wherein said demultiplexed signals amplified by said corresponding semiconductor optical amplifiers are reflected by said reflector to go back through said semiconductor optical amplifiers again, combined by said demultiplexer/multiplexer to produce a multiplexed signal, and said multiplexed signal exits from said first end of said optical waveguide as an amplified optical output signal.

10. A semiconductor optical amplifier module according to claim 9, wherein said optical waveguide, said demultiplexer/multiplexer, and said semiconductor optical amplifiers are integrated on a single semiconductor substrate.

11. A semiconductor optical amplifier module comprising:

an input optical waveguide arranged to receive at a first end thereof an optical input signal containing a plurality of wavelength components;

a beam splitter arranged in a manner crossing said optical waveguide;

an output optical waveguide optically coupled to said beam splitter;

a demultiplexer/multiplexer optically coupled to a second end of said input optical waveguide to separate said optical input signal into a plurality of demultiplexed signals, each of said demultiplexed signals having a different one of said wavelength components;

a plurality of optical semiconductor amplifiers each having a first end optically coupled to said demultiplexer/multiplexer to amplify a corresponding one of said demultiplexed signals; and a reflector arranged at a second end of each of said semiconductor optical amplifiers, said second end being an end which is not coupled to said demultiplexer/multiplexer, wherein said demultiplexed signals amplified by said corresponding semiconductor optical amplifiers are reflected by said reflector to go back through said semiconductor optical amplifiers again, combined by said demultiplexer/multiplexer to provide a multiplexed signal, and said multiplexed signal exits from said first end of said optical waveguide via said beam splitter as an amplified optical output signal.

12. A semiconductor optical amplifier module according to claim 11, wherein said input optical waveguide, said beam splitter, said output optical waveguide, said demultiplexer/multiplexer, and said semiconductor optical amplifiers are integrated on a single semiconductor substrate.

13. A semiconductor optical amplifier module according to claim 7, wherein said demultiplexer is implemented by a first arrayed waveguide diffraction grating structure for separating an optical input signal containing a plurality of wavelength components into a plurality of demultiplexed signals, each of said demultiplexed signals having a different one of said wavelength components, said semiconductor optical amplifiers are implemented by a multiple quantum well structure having well widths ranging from a minimum value to a maximum value, and said multiplexer has a second arrayed waveguide diffraction grating.

14. A semiconductor optical amplifier module according to claim 7, wherein said plurality of semiconductor optical amplifiers provide gain spectrum widths ranging substantially from 80 nm to 800 nm.

15. A semiconductor optical amplifier module according to claim 9, wherein said plurality of semiconductor optical amplifiers provide gain wavelength bandwidths ranging substantially from 80 nm to 800 nm.

16. A semiconductor optical amplifier module according to claim 11, wherein said plurality of semiconductor optical amplifiers provide gain spectrum widths ranging substantially from 80 nm to 800 nm.

17. An optical communication system for transmitting optical signals each having a different wavelength through the semiconductor optical amplifier module defined in claim 1.

18. An optical communication system for transmitting optical signals each having a different wavelength through the semiconductor optical amplifier module defined in claim 7.

19. An optical communication system for transmitting optical signals each having a different wavelength through the semiconductor optical amplifier module defined in claim 11.

* * * * *